United States Patent [19]

Crewe et al.

[11] 4,303,864
[45] Dec. 1, 1981

[54] SEXTUPOLE SYSTEM FOR THE CORRECTION OF SPHERICAL ABERRATION

[75] Inventors: Albert V. Crewe, Palos Park; David A. Kopf, Chicago, both of Ill.

[73] Assignee: The United States of America as represented by the United States Department of Energy, Washington, D.C.

[21] Appl. No.: 88,224

[22] Filed: Oct. 25, 1979

[51] Int. Cl.³ .......................... G21K 1/08; H01J 3/14; H01J 3/26
[52] U.S. Cl. .............................. 250/396 R; 313/361.1
[58] Field of Search ........... 250/396 R, 396 ML, 311, 250/306; 313/361, 426

[56] References Cited

U.S. PATENT DOCUMENTS 3,753,034  8/1973  Spicer .................................. 250/396
3,781,732  12/1973  Wollnik ............................... 250/396

*Primary Examiner*—Bruce C. Anderson
*Attorney, Agent, or Firm*—Paul A. Gottlieb; Frank H. Jackson; Richard G. Besha

[57] ABSTRACT

A means is provided for compensating for spherical aberration in charged particle beam devices. The means includes a sextupole positioned between two focusing lenses.

4 Claims, 3 Drawing Figures

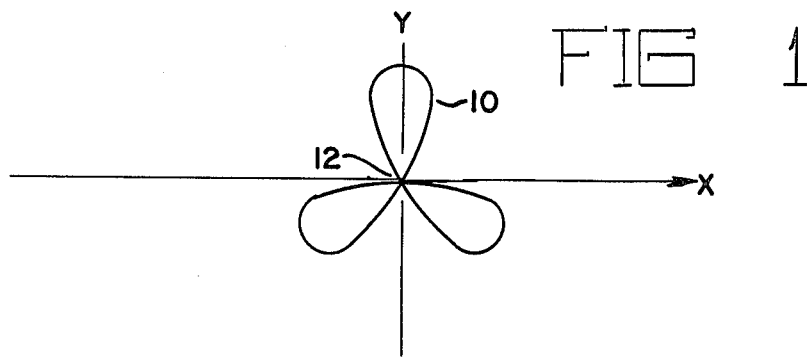
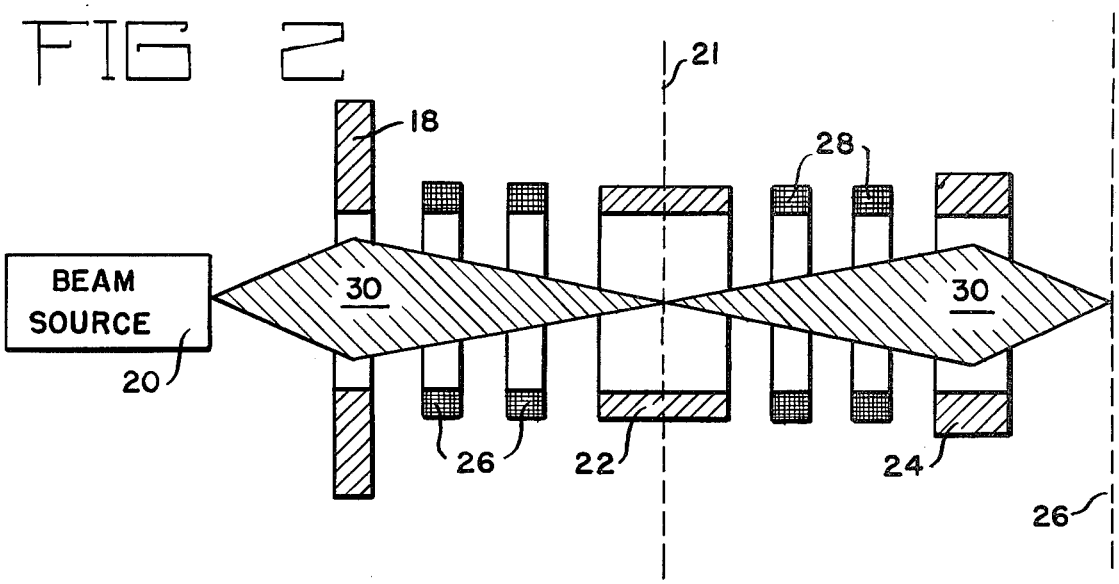
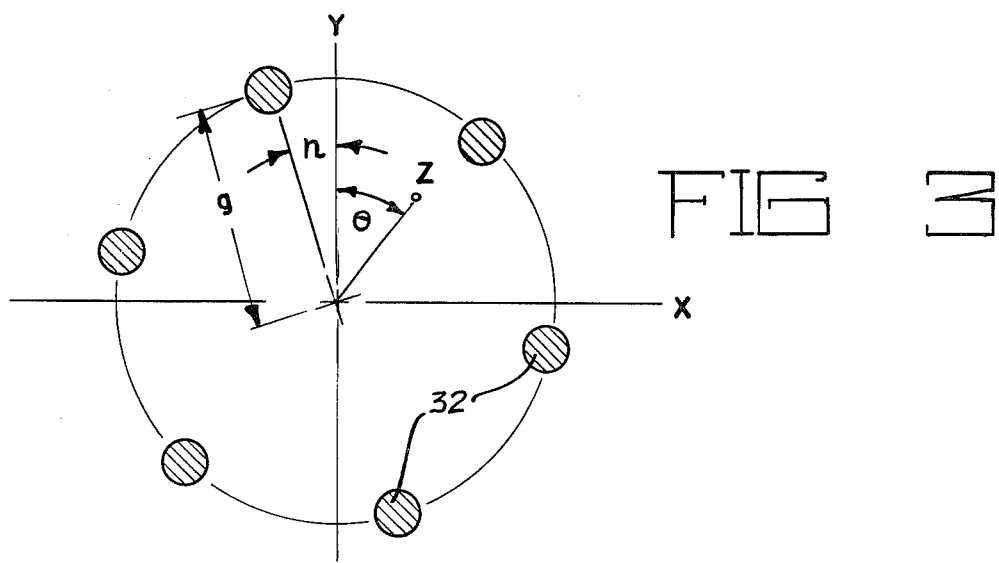

SEXTUPOLE SYSTEM FOR THE CORRECTION OF SPHERICAL ABERRATION

CONTRACTUAL ORIGIN OF THE INVENTION

The invention described herein was made in the course of, or under, a contract with the UNITED STATES DEPARTMENT OF ENERGY.

BACKGROUND OF THE INVENTION

Charged particle beam systems, which are devices where an electron beam is brought to a final focus using magnetic or electrostatic lenses, have their performance limited at this time by spherical or third-order aberration of the lenses. Examples of such electron beam devices are electron microscopes, electron microanalyzers, ion microscopes, and scanning transmission electron microscopes. Spherical aberration occurs in systems where only an image point on the optical axis is desired and where off-axis focusing of the beam occurs.

In 1936, Schertzer (Z. Physik, 101 (1936), page 593) showed that the coefficient of spherical aberration of such lenses always has the same sign and one, therefore, presumes that it cannot be made zero. By stating that the coefficient of spherical aberration always has the same sign, this means that the focused electron beam will cross the optical axis before or in the image plane. According to Schertzer, the only examples of systems having zero aberration are hypothetical and, to date, impractical. (See W. Glase, Z. Physik, 116 (1940), pages 19–33, and A. V. Crewe, Ultramicroscopy, 2 (1977), page 281.) Schertzer's conclusions are based upon the symmetry of the lenses and therefore one might hope to avoid the problem by using systems of lenses which are not cylindrically symmetric. Schertzer in 1947 proposed a scheme which uses what are now called multipole lenses. Specifically, he proposed quadrupoles and octupoles to act together as a device to provide an equal but opposite effect to the aberrations of a round lens. Attempts to build such multipole lenses have been made but have not been successful. These attempts are summarized in the Proceedings of the Ninth International Congress on Electron Microscopy by H. Koops, Toronto, Canada, Vol. 3 (1978), page 185. Failure of these attempts was not because they were based on faulty principles but because the combination of multipole lenses must be made and installed with a degree of precision which is beyond the state of the art. For example, such a device has been constructed at the University of Chicago under direction of one of the coinventors herein, A. V. Crewe. The University of Chicago device has four quadrupoles and three octupoles for a total of 40 pole pieces. The mechanical tolerances were calculated to be such that each pole piece must be positioned to an accuracy of 0.00001 cm. The simplest proposed device uses two sextupoles and one additional round lens which would reduce the number of elements from seven to three.

It is therefore an object of this invention to provide a means for compensating for spherical aberration in a charged particle beam system.

Another object of this invention is to provide a one element means for compensating for spherical aberration in a charged particle beam system.

SUMMARY OF THE INVENTION

In an electron beam device in which an electron beam is developed and then focused by a lens to a particular spot, there is provided a means for eliminating spherical aberration. A sextupole electromagnetic lens is positioned between two focusing lenses. The interaction of the sextupole with the beam compensates for spherical aberration.

DESCRIPTION OF THE DRAWINGS

FIG. 1 shows the distribution of a charged particle electron beam normally to be expected after having passed through a sextupole, FIG. 2 shows a charged particle beam instrument, and FIG. 3 shows a coordinate system for analyzing the effect of the sextupole.

DETAILED DESCRIPTION OF THE INVENTION

A sextupole is an electromagnetic focusing lens which can be generically described as having six electrodes or poles spaced symmetrically about and parallel to an optical axis, with each of the electrodes being of alternate polarity. As is well known, sextupoles can be electrical by being formed of parallel wires having currents passed therethrough, electrostatic by having voltages applied to plates or magnetic by proper arrangement of the poles of a magnet. If one looks at the usual effect of a sextupole as shown in FIG. 1, in which the image appears, a three-lobed figure 10 about the optical axis 12 is produced. The three lobes occur when a collimated beam is sent through the sextupole parallel with the optical axis. Looking at this beam distribution in the image plane, it would not be apparent that such could be ulitized to eliminate spherical aberration from charged particle beam systems, since spherical aberration is a phenomenon uniformly distributed about the optical axis of such a beam device. The pattern shown in FIG. 1 developed by the sextupole is sometimes called a second-order astigmatism, i.e. the three-leaved clover leaf.

Previous considerations for sextupoles in beam devices for the correction of aberration have assumed the sextupole to be infinitely narrow in order to calculate the effect the sextupole will have on aberrations. However, sextupoles do have a finite length and by examining the sextupole in terms of its finite length it has been determined that it can be utilized in charged particle beam instruments to eliminate spherical aberration. By focusing the particle beam in the center of the sextupole, the second-order astigmatism, i.e. the clover-leaf distribution, can be eliminated due to the combined effect of the means for focusing the beam into the sextupole and the sextupole itself. Then the aberrations of the sextupole can be used to correct the spherical aberrations of a round lens simply by properly adjusting the strength of the sextupole such as by adjusting the voltage or current.

Referring to FIG. 2, there is shown one embodiment of a charged particle beam device utilizing a sextupole to eliminate spherical aberration. A means for focusing a beam of particles such as an electromagnetic lens 18 is used to focus a beam of particles from a small source 20 at an image plane 21 at the center of a sextupole 22. The output of the sextupole 22 is focused by a second electromagnetic lens 24 to produce the final image in the final image plane 26. A small source is one whose size is small compared to the effect of the spherical aberration caused by lens 24. By adjusting the sextupole voltage or current, the final image will be free from spherical aberration.

In practice, adjustments must be made so that the particle beam passes accurately along the axis. These can be obtained by steering coil pairs 26 and 28. The same effect could be produced by physical movement of sexupole 22 itself. The cross section of the desired beam path is shown in FIG. 2 as the cross-hatched area 30.

An electron beam device, then, having the sextupole to correct for spherical aberration, will have considerable simplification over all other devices proposed for this purpose. With spherical aberration corrected, a decrease in probe size or an increase in resolving power or an increase in current for the same probe size for resolving power are obtainable.

Referring to FIG. 3, we can most easily describe a sextupole 32 with a potential distribution given by $$\phi = Cr^3 \sin(3\theta + \eta)$$

where r is the radial coordinate, $\theta$ the azimuthal coordinate and $\eta$ is a phase factor which allows an arbitrary rotation. For simplicity we take the potential to be independent of z, the axial coordinate along the optic axis. That is to say, we will ignore end effects. As we shall see, this seems to be a reasonable approximation since we will require sextupoles which are long compared to their diameter.

It is more convenient to use rectangular coordinates so we write $x = r \cos\theta$, $y = r \sin\theta$ and we obtain $$\phi = C[(3x^2y - y^3)\cos\eta + (x^3 - 3xy^2)\sin\eta]$$

We will consider magnetic sextupoles although electrostatic ones would be equally effective. In this case, we can readily write the field components as $$B_x = -3C[2xy \cos\eta + (x^2 - y^2)\sin\eta]$$

$$B_y = -3C[(x^2 - y^2)\cos\eta - 2xy \sin\eta]$$

and there is no loss of generality if we take $\eta = \pi$. Then we have the simpler expressions $$B_x = 3C(2xy)$$

$$B_y = 3C(x^2 - y^2)$$

The equations of motion are easily written down using the Lorentz equation $$\ddot{x} = -\frac{e}{mc} B_x \dot{z}$$

$$\ddot{y} = \frac{e}{mc} B_x \dot{z}$$

$$\ddot{z} = \frac{e}{mc}(B_x \dot{y} - B_y \dot{x})$$

and we can eliminate time as a variable in two steps. First, we use z as the independent variable by writing $\dot{x} = x'\dot{z}$, $\ddot{x} = x''\dot{z}^2 + x'\ddot{z}$ where the primes refer to differentiation with respect to z. With a little rearrangement we obtain two equations $$x'' = \frac{e}{mc\dot{z}}(B_y(1 + x'^2) - B_x x'y')$$

$$y'' = -\frac{e}{mc\dot{z}}(B_x(1 + y'^2) - B_y x'y')$$

The remaining factor which involves time is the axial velocity $\dot{z}$. Conservation of energy requires that $$v^2 = \dot{z}^2(1 + x'^2 + y'^2)$$

where v is the velocity of the electrons. It is convenient now to eliminate the velocity by noting that $$e/mcv = 1/R$$

where R is the magnetic rigidity of the electrons measured in gauss-cm.

Our equations then take the form $$x'' = \frac{1}{R}(B_y(1 + x'^2) - B_x x'y')(1 + x'^2 + y'^2)^{\frac{1}{2}}$$

$$y'' = -\frac{1}{R}(B_x(1 + y'^2) - B_y x'y')(1 + x'^2 + y'^2)^{\frac{1}{2}}$$

If we now insert our values for $B_x$ and $B_y$ and expand the expressions, we obtain our final equations of motion $$x'' = k(x^2 - y^2) + \text{4th order terms} \ldots$$

$$y'' = -2kxy + \text{4th order terms} \ldots$$

where $k = 3C/R$. Since we are only interested in extending our analysis to third order, we can neglect all terms except the first one in each case.

The simplest way to seek a solution to these equations is to use a series expansion $$x = \sum_{n=0}^{\infty} a_n z^n; \quad y = \sum_{n=0}^{\infty} b_n z^n$$

and substitute this solution into the differential equation in order to evaluate the coefficients. The coefficients $a_o$ and $b_o$ clearly represent the initial amplitudes $x_o$ and $y_o$ while $a_1$ and $b_1$ represent the initial slopes $x_o'$ and $y_o'$. It is necessary to consider terms up to $n = 7$ in order to obtain a solution which is complete to third order in these amplitudes and slopes. The results we obtain is $$x = x_o + x_o'z + k\left[\frac{(x_o^2 - y_o^2)z^2}{2} + \frac{(x_o x_o' - y_o y_o')z^3}{3} + \frac{(x_o'^2 - y_o'^2)z^4}{12}\right] + k^2\left[\frac{x_o(x_o^2 + y_o^2)z^4}{12} + \left(\frac{x_o^2 x_o'}{12} - \frac{x_o'y_o^2}{60} + \frac{x_o y_o y_o'}{10}\right)z^5 + \left(\frac{x_o x_o'^2}{36} + \frac{x_o y_o'^2}{60} + \frac{x_o' y_o y_o'}{90}\right)z^6 + \frac{x_o'(x_o'^2 + y_o'^2)z^7}{252}\right]$$

$$y = y_o'z + k\left[-x_o y_o z^2 - \frac{x_o y_o' + x_o' y_o)z^3}{3} - \frac{x_o' y_o' z^4}{6}\right] + k^2\left[\frac{y_o(x_o + y_o^2)^2 z^4}{12} + \left(\frac{y_o y_o'}{12} - \frac{x_o^2 y_o'}{60} + \frac{x_o x_o' y_o}{10}\right)z^5 + \left(\frac{y_o y_o'^2}{36} + \frac{x_o'^2 y_o}{60} + \frac{x_o x_o' y_o'}{90}\right)z^6 + \frac{y_o'(x_o'^2 + y_o'^2)z^7}{252}\right]$$

These expressions appear to be somewhat clumsy and intractable, but they can be put into a more convenient and interesting form with some simple substitutions.

If we make the reasonable assumption that there is a point source or virtual image somewhere along the axis and that this image is free from astigmatism, we note that the distance of this source in front of the sextupole is given by $S = x_0/x_0'$ or $y_0/y_0'$, and it is then convenient to write $$x_0' = x_0\gamma/z; \quad y_0' = y_0\gamma/z$$

so that $S = -z/\gamma$ and then $-1/\gamma$ gives the value of S measured in units of the length of the sextupole. It is also convenient now to return to cylindrical coordinates. Then the solutions can be rewritten as $$x_1 = r_1\cos\theta_1 = r_0(1 + \gamma)\cos\theta +$$
$$kr_0^2z^2\left(\frac{1}{2} + \frac{\gamma}{3} + \frac{\gamma^2}{12}\right)\cos\theta +$$
$$k^2r_0^3z^4\left(\frac{1}{12} + \frac{\gamma}{12} + \frac{\gamma^2}{36} + \frac{\gamma^3}{252}\right)\cos\theta.$$

$$y_1 = r_1\sin\theta_1 = r_0(1 + 2)\sin\theta -$$
$$kr_0^2z^2\left(\frac{1}{2} + \frac{\gamma}{3} + \frac{\gamma^2}{12}\right)\sin 2\theta +$$
$$k^2r_0^3z^4\left(\frac{1}{12} + \frac{\gamma}{12} + \frac{\gamma^2}{36} + \frac{\gamma^3}{252}\right)\sin\theta$$

where the subscripts 1 refer to the values at the exit of the sextupoles whose length is z.

The emergent slopes can also be calculated by differentiation and put into the same format as $$x_1' = r_1'\cos\theta_1 = \frac{r_0\gamma}{z}\cos\theta + kr_0^2z\left(1 + \gamma + \frac{\gamma^2}{3}\right)\cos 2\theta$$
$$+ k^2r_0^3z^3\left(\frac{1}{3} + \frac{5\gamma}{12} + \frac{\gamma^2}{6} + \frac{\gamma^3}{36}\right)\cos\theta$$

$$y_1' = r_1'\sin\theta_1 = \frac{r_0\gamma}{z}\sin\theta - kr_0^2z\left(1 + \gamma + \frac{\gamma^2}{3}\right)\sin 2\theta$$
$$+ k^2r_0^3z^3\left(\frac{1}{3} + \frac{5\gamma}{12} + \frac{\gamma^2}{6} + \frac{\gamma^3}{36}\right)\sin\theta$$

The interpretation of these equations is now clear. The first term in $x_1$ or $y_1$ indicates that there is no first order focusing because it is independent of k, the strength of the sextupole. Therefore, to a first approximation the amplitudes (and slopes) are just those which would have been obtained at the same position without the sextupole.

The second term can be also understood. It is convenient to write $$x_1 = r_0(1 + \gamma)\cos\theta + kr_0^2z^2L\cos 2\theta + k^2r_0^3z^4M\cos\theta$$
$$x_1' = \frac{r_0\gamma}{z}\cos\theta + kr_0^2z\,N\cos 2\theta + k^2r_0^2z^3\,P\cos\theta$$

with similar expressions for $y_1$ and $y_1'$.

Taking the first two terms only, we then have $$x_1^2 = r_1^2\cos^2\theta_1 = r_0^2(1 + \gamma)^2\cos^2\theta + 2kr_0^3z^2(1 + \gamma)L\cos\theta\cos 2\theta...$$
and then
$$r_1^2 = x_1^2 + y_1^2 = r_0^2(1 + \gamma)^2 + 2kr_0^3z^2(1 + \gamma)L\cos 3\theta$$

so that if $kz^2$ is small, we can write $$r_1 = r_0(1+\gamma) + kr_0^2z^2L\cos 3\theta$$

and we see that the sextupole action is clearly demonstrated by the cos $3\phi$ term. The third term is cylindrically symmetric and is of third order in $r_0$. It is this term which is of interest.

It would be impractical to place the end of the sextupole inside the field of a lens and we must assume that there exists a drift space between the two. We should therefore project the complete solution to give the values of $x_2$, $y_2$, etc. at some distance l from the exit of the sextupole. Again it is convenient to normalize the length of this drift space by writing $l = pz$. The transfer matrix for this section can be written $$\begin{pmatrix} 1 & pz \\ 0 & 1 \end{pmatrix}$$

and the matrix operates on the vectors $$\begin{pmatrix} x_1 \\ x_1' \end{pmatrix} \begin{pmatrix} y_1 \\ y_1' \end{pmatrix}$$

If we denote the new values with the subscript 2, we have $$x_2 = r_0(1 + \gamma(1 + p))\cos\theta + kr_0^2z^2(L + Np)\cos 2\theta$$
$$+ k^2r_0^3z^4(M + Pp)\cos\theta$$
$$y_2 = r_0(1 + \gamma(1 + p))\sin\theta - kr_0^2z^2(L + Np)\sin 2\theta$$
$$+ k^2r_0^3z^4(M + Pp)\sin\theta$$
$$x_2' = x_1'$$
$$y_2' = y_1'$$

The simplest way to understand the action of the sextupole is to consider what happens when the beam given by $$\begin{pmatrix} r_2 \\ r_2' \end{pmatrix}$$

passes through an aberration-free lens and then compare the result to what would have been expected without the sextupole but using a more realistic lens. It is true that this is only an approximate method, but the errors involved are of higher order than the effect we are calculating and can be ignored.

A prefect lens can be conveniently represented by a transfer matrix $$\begin{pmatrix} m_{11} & m_{12} \\ m_{21} & m_{22} \end{pmatrix}$$

where we make no assumptions about the matrix elements and in particular we do not imply that it is either a thick or a thin lens.

We are only interested in the amplitude of the ray which emerges from the lens and this amplitude is clearly $$x_3 = m_{11}x_2 + m_{12}x_2'$$

Our principal interest is in the amplitude at the position of the paraxial focus so $r_3$ must be zero when we use the lowest order approximation for $r_2$ and $r_2'$. Specifically, then $$m_{12} = -m_{11}(1+\gamma(1+p))z/\gamma$$

It is clear, then, that only the matrix element $m_{11}$ is involved and it will be a constant multiplying factor. Therefore, we do not need an exact value and we can obtain an approximate one by considering the result of applying the matrix to a vector $$\begin{pmatrix} x_2 + \delta \\ x_2' \end{pmatrix}$$

which represents an object of height $\delta$ at the position of the source. Applying the matrix we have $$x_3 = m_{11}x_2 + m_{12}x_2' + m_{11}\delta$$

And, therefore, at the paraxial focus we have $$x_3 = m_{11}\delta$$

The matrix element $m_{11}$ is then just the magnification of the lens. Since we only need an approximate value, we can take the magnification to be the negative of the ratio of the image distance to the object distance or $$m_{11} = -\frac{f\gamma}{z(1+\gamma(1+p))}$$

and then we can readily see that $m_{12} = f$.

If we now use these values to calculate the image aberration produced by the higher order terms at the paraxial focus, we obtain $$\Delta x = \frac{fkr_o^2 z}{1+\gamma(1+p)}(N(1+\gamma) - L\gamma)\cos 2\theta$$
$$+ \frac{fk^2 r_o^3 z^3}{1+\gamma(1+p)}(P(1+\gamma) - M\gamma)\cos\theta$$
$$y = -\frac{fkr_o^2 z}{1+\gamma(1+p)}(N(1+\gamma) - L\gamma)\sin 2\theta$$
$$+ \frac{fk^2 r_o^3 z^3}{1+\gamma(1+p)}(P(1+\gamma) - M\gamma)\sin\theta$$

In order for a corrector to be useful it is necessary to eliminate the primary action of the sextupole. It can be seen that this can readily be accomplished by setting $$N(1+\gamma) = L\gamma$$

When the values for N and L are substituted this reduces to $$1 + 3\gamma/2 + \gamma^2 + \gamma^2 + \gamma^3/4 = 0.$$

This equation has one real zero which occurs when $\gamma = -2$. This represents a set of rays which have a crossover exactly at the center of the sextupole, a result which could have been anticipated. Using this value for $\gamma$ we have $P = -1/18$ $M = -1/252$ and then we obtain $$\Delta x = -\frac{1}{21}\frac{fk^2 r_o^3 z^3}{(1+2p)}\cos\theta$$
$$\Delta y = -\frac{1}{21}\frac{fk^2 r_o^3 z^3}{(1+2p)}\sin\theta$$

and it is now clear that the image aberration is cylindrisymmetric with a value $$\Delta r = -\frac{1}{21}\frac{fk^2 r_o^3 z^3}{(1+2p)}$$

We can now compare this value with what we could have expected for a similar set of conditions but with the sextupole turned off and using a lens with a definite value of the spherical aberration constant $C_s$.

Assuming that the source is far from the lens, we would have expected $$\Delta r = C_s r_3'^3$$

where $r_3'$ is the convergence angle of the electron beam at the image. A perfectly adequate approximation is $$r_3' = -\frac{r_2}{f} = -\frac{r_o}{f}(1 + \gamma(1+p))$$

and then the expected value for $\Delta r$ is $$\Delta r = -C_s \frac{r_o^3}{f^3}(1 + \gamma(1+p))^3$$

which, in the case of $\gamma = -2$ reduces to $$\Delta r = C_s \frac{r_o^3}{f^3}(1 + 2p)^3$$

and this clearly has the opposite sign to the case with the sextupole turned on and a perfect lens is used. We can, therefore, achieve correction by adding these two values of $\Delta r$ and equating to zero. The result is then $$k^2 = 21(1+2p)^4 \frac{C_s}{f^4 z^3}$$

and, since all quantities on the right are positive, it must always be possible to find a value of k to satisfy the equation.

An actual example involving a real system is the design of such a sextupole device to correct the aberration in a lens of focal length 1 mm, a value of $C_s$ of 0.4 mm operating with 50,000 volt electrons. Applying the principles given above and using an electrical sextupole, the parameters of the beam system will be z = length of sextupole = 10 cm
l = length of drift space = 5 cm
g = radius of sextupole (see FIG. 3) = 0.15 cm
I = current in wires shown in cross section in FIG. 3 which form sextupole 32 (alternately directed into and out of the paper) = 7.78 amps k = 1.74 cm$^{-3}$.

The embodiments of the invention in which an exclusive property or privilege is claimed are defined as follows:

1. In an electron beam device having a source of electrons, the improvement in the device for correcting spherical aberration, comprising: a first lens for focusing the beam to a point, a sextupole for focusing a beam in an image plane having a third order, spherical aberration, the point being at the center of said sextupole, and a second lens positioned at the image plane of said sextupole for focusing the beam to a point in an image plane.

2. The device of claim 1 further including steering means for aligning said beam along the optical axis of the device.

3. The device of claim 2 wherein said steering means includes two pairs of steering coils with one coil positioned on either side of said sextupole between said sextupole and one of said lenses.

4. The device of claim 3 wherein said second lens has a focal length of 1 mm, a value of spherical aberration constant of 0.4 mm, the source produces 50,000 volt electrons, said sextupole is electrical of length 10 cm, drift space 5 cm, and width 0.15 cm and current in each wire from said electrical sextupole of 7.78 amperes.

* * * * *